United States Patent [19]
Flaitz et al.

[11] Patent Number: 5,130,067
[45] Date of Patent: Jul. 14, 1992

[54] METHOD AND MEANS FOR CO-SINTERING CERAMIC/METAL MLC SUBSTRATES

[75] Inventors: Philip L. Flaitz, Hopewell Junction; Arlyne M. Flanagan, Staatsburg; Joseph M. Harvilchuck, Billings; Lester W. Herron, Hopewell Junction; John U. Knickerbocker, Hopewell Junction; Robert W. Nufer, Hopewell Junction; Charles H. Perry, Poughkeepsie; Srinivasa N. Reddy; Steven P. Young, both of Lagrangeville, all of N.Y.

[73] Assignee: International Business Machines Corporation, Armonk, N.Y.

[21] Appl. No.: 859,093

[22] Filed: May 2, 1986

[51] Int. Cl.$^5$ ............................................. C04B 35/64
[52] U.S. Cl. ................................... 264/60; 156/89; 432/258; 432/259; 264/57; 264/61; 264/63
[58] Field of Search ...................... 264/63, 60, 57, 61; 432/258, 259; 156/89

[56] References Cited

U.S. PATENT DOCUMENTS

| | | | |
|---|---|---|---|
| 3,310,392 | 3/1967 | Rhodes et al. | |
| 3,436,451 | 4/1969 | Wasser | 264/272 |
| 3,897,509 | 4/1975 | Elderbaum | 264/56 |
| 4,009,238 | 2/1977 | Niedermeier et al. | 264/61 |
| 4,259,061 | 3/1981 | Dubetsky et al. | 432/13 |
| 4,340,436 | 7/1982 | Dubetsky et al. | 156/89 |

OTHER PUBLICATIONS

Brownlow et al., IBM TDB, vol. 23, No. 5, Oct. 1980, pp. 1885-1886, "Method for Reduction of Shrinkage Distortion in Ceramic Substrates".

Primary Examiner—James Derrington
Attorney, Agent, or Firm—Ira David Blecker

[57] ABSTRACT

A method for co-sintering ceramic/metal multi-layered ceramic substrates wherein X-Y shrinkage is controlled and X-Y distortion and Z-direction chamber are substantially eliminated. Binder-burnoff is substantially not aggravated during this process as well. The process is accomplished by applying selective forces to the surfaces of the ceramic substrates to control lateral movement while allowing Z direction shrinkage movement. Frictional force means, pneumatic forced means and weights are among the means used to supply forces. Cerium oxide is used in certain embodiments to enhance binder-burnoff.

21 Claims, 3 Drawing Sheets

METHOD AND MEANS FOR CO-SINTERING CERAMIC/METAL MLC SUBSTRATES

The invention relates to the fabrication of fired ceramic sheets and more particularly to a method of fabricating ceramic and metallurgy substrates which controls X-Y dimensional shrinkage and eliminates X-Y distortion and Z-curvature, or camber, of the fired sheets.

BACKGROUND OF THE INVENTION

Ceramic sheets are of particular importance in the electronics industry for the packaging/mounting of semiconductor integrated devices and other elements, given the high densities attainable in a multilayer ceramic structure. The fabrication of ceramic substrates generally is well-known (see U.S. Pat. Nos. 3,423,517 and 3,723,176) and entails the following well-known processing steps: mixing the ceramic "paint" of ceramic, binder and solvents, casting the "green" sheets, drying the sheets, blanking and punching via holes in the sheets, screening metallurgy into the vias, stacking, laminating, and firing, consisting of driving of the binder and finally sintering the structure. A similar processing profile is followed regardless of the specific components of the ceramic material, alumina, mullite, glass ceramic, etc. Illustration of the processing steps as applied to glass-ceramic structures can be seen in U.S. Pat. Nos. 4,340,436 of Dubetsky et al; 4,234,367 Herron et al, and 4,301,324 of Kumar et al, the teachings of which are herein incorporated by reference.

Of particular concern in processing the ceramic structure is the shrinkage and distortion which the structure undergoes during sintering. In addition to linear, reproducible shrinkage in the X-Y plane, there is non-linear X-Y shrinkage, via bulge, and curvature in the Z direction, which is referred to as camber.

Various methods of reducing the effects of shrinkage and Z-direction distortion have been proposed. Several patented methods, U.S. Pat. No. 4,009,238 of Niedermeier et al, U.S. Pat. No. 3,310,392 of Rhodes and U.S. Pat. No. 3,436,451 of Wasser, teach the use of applied pressure to alleviate camber during sintering and to insure a planar surface. Weights applied to the substrate during sintering have also been used to eliminate camber, along with the corrective measure of applying heat and pressure after sintering to reshape the ceramic (see U.S. Pat. No. 4,340,436 of Dubetsky et al, Col. 4 lines 40-52).

Later teachings have expressed a theory that the Z-direction camber or warpage is the result of the varying rates of shrinkage and different percent volume shrinkage of the ceramic and accompanying metallurgy, in part due to the differing shrinkage onset temperatures and different total volume shrinkage. Differing thermal coefficients of expansion and in situ frictional forces create stress-related non-uniformities. Furthermore, the non-uniform distribution of metallization in the ceramics contributes to the overall distortion. In response to these concerns Brownlow et al (IBM Technical Disclosure Bulletin Vol. 23, No. 5, October 1980, page 1885) and Elderbaum (U.S. Pat. No. 3,879,509) illustrate the use of specially shaped shims, weights, and fusible frames capable of exerting uneven pressure on certain areas of the substrate during lamination and sintering, respectively, in attempts to compensate for and/or equalize the shrinkage. Still others (U.S. Pat. No. 4,109,377, Blazick et al and U.S. Pat. No. 3,978,248, Usami) have attempted to alter the compositions of the ceramic and metallurgy so that the two will be more closely compatible in shrinkage rates and overall volume shrinkage.

Many of the above-cited methods have been useful in lessening the effects of Z-curvature, though not of X-Y shrinkage or distortion. Furthermore, the use of glass-ceramic/copper metallurgy structures occasions new problems. Corrective measures such as the post-sintering heating and pressure reshaping treatment, mentioned above, are ineffective for glassceramic/copper substrates. The glass crystallizes during the sintering step and cannot, therefore, be "remelted" and reformed without extreme difficulty at extreme temperatures at which most metallurgies will melt. A further requirement of a glass-ceramic H/H copper metallurgy substrate is that the binder burn-off and sintering be conducted in a neutral or a reducing atmosphere due to the high oxidizing potential of the copper. As taught in the Dubetsky et al patent, U.S. Pat. No. 4,340,436 an ambient for which the partial pressure of $O_2$ is controlled, such as $H_2O/H_2$, is preferable, since reducing ambients may cause adhesion problems. Necessarily, the substrate surface must be exposed to the ambients in order for the process to be effective. The use of shims, pressure platens or weights on the surface presents a problem in this regard. The Dubetsky solution involves a two-step process whereby the binder burn-off is conducted with the substrate surface unobstructed. The heating process is then halted and an inert weight in the form of a co-extensive platen is applied to the surface of the structure. The structure is then returned to the furnace for completion of the sintering and crystallization. The Dubetsky process is moderately effective in addressing the Z-curvature difficulty; however, it has been determined that a good percentage (33-50%) of the total fired shrinkage and accompanying distortion, camber and via bulge, occurs during the binder burn-off step when the top surface of the substrate must have free, unobstructed access to the atmosphere. During the burn-off step, very small temperature gradients have a pronounced effect on the amount of shrinkage and distortion. Furthermore, neither Dubetsky nor any of the other prior methods are able to reduce the problems of X-Y shrinkage and X-Y distortion. The Elderbaum patent, in fact, teaches away from preventing lateral shrinkage, (see Column 2, lines 14-16), lest the sheet rupture. In general, the industry has accepted the inevitability of shrinkage and attempted to design around the shrinkage problem. Provided that the shrinkage is uniform or "reproducible", the substrate can be sized to allow for the anticipated shrinkage either before or after sintering. Another U.S. patent issued to Dubetsky, U.S. Pat. No. 4,259,061, teaches a method of firing the ceramic element on a refractory material setter tile to assure uniform shrinkage. Again, however, the shrinkage presumably cannot be eliminated.

It is therefore one of the objects of this invention to provide a means and method for fabricating ceramic sheets which eliminates shrinkage, camber and distortion in said sheets.

It is a further object to provide a method for preventing shrinkage, camber and distortion of glassceramic sheets while allowing atmospheric access to the surface of the substrate during firing.

It is another object of the invention to provide planar ceramic substrates requiring a continual uninterrupted burn-off and sintering cycle.

It is still another object of the invention to provide for planarity and dimensional integrity in a ceramic substrate or in a multilayered metallized ceramic substrate (i.e. MLC), without need of wasteful resizing or reworking.

SUMMARY OF THE INVENTION

These and other objects are realized by the subject inventive means and methods incorporating the application of selective forces to the ceramic structure to control lateral movement during sintering so as to obtain predictable X-Y shrinkage, and substantially zero camber or distortion of the substrate.

BRIEF DESCRIPTION OF THE DRAWINGS

The subject invention will be described in greater detail with reference to the drawings wherein.

DETAILED DESCRIPTION OF THE DRAWINGS

Figure 1:
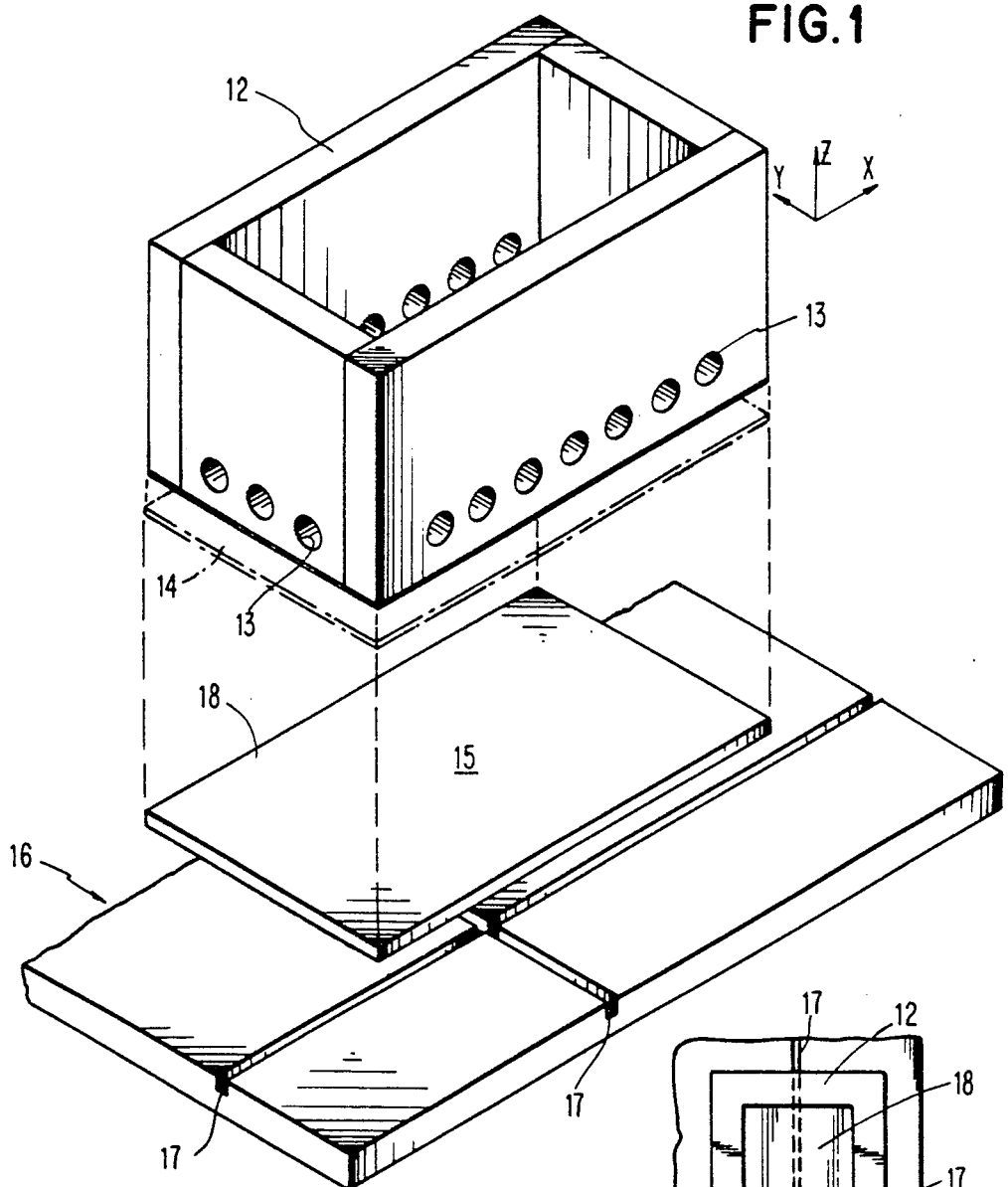
FIG. 1 is an exploded perspective plan view of the substrate, contact sheet and peripheral weight as oriented prior to sintering.

Sheets of ceramic "greenware" experience a high degree of shrinkage and distortion during sintering. In addressing the shrinkage problem, ceramic particulates and the corresponding metallurgy (i.e. as incorporated in MLC substrates) have been chosen for the similarities of their respective rates of shrinkage, such as alumina ceramic with molybdenum metallurgy and glass-ceramics with copper metallurgy. Control of the sintering environment has also been attempted as a means for modifying shrinkage. In general, however, the industry has accepted shrinkage as a necessary result of the process and has designed around it either by resizing the ceramic element after sintering or by anticipating the percent shrinkage rate and merely blanking the prefired sheets to dimensions which are the predetermined percentage, for example 17% for alumina sheets, above the desired finished dimensions. The cut and shrink method is effective, although wasteful, provided that only linear, reproducible X-Y shrinkage occurs. Once the green substrate experiences nonlinear X-Y shrinkage, referred to as distortion, the fired substrate becomes unusable. Similarly, once Z-curvature, referred to as camber, results, the substrates are virtually valueless. As noted above, the camber problem can sometimes be rectified, after sintering has been completed, by applying heat and a flattening pressure to the substrate. This however is not effective when using glass-ceramics containing crystallizable glasses, given the extreme temperatures, above the crystallization temperature, which would be necessary in order to achieve a reformation of the glass-ceramic substrate. Efforts have been made to eliminate camber by various means, generally incorporating the use of a weight on the upper surface of the substrate, thereby preventing warpage in the Z-direction. The Brownlow et al reference (IBM Technical Disclosure Bulletin, Vol. 23, No. 5, October 1980, page 1885) demonstrates specially shaped shims to be used when applying pressure in the laminating process for ceramic substrates. Brownlow et al addresses the fact that the pattern of shrinkage is radial. It is, therefore, attempted therein to reshape the substrate prior to sintering, during the lamination step, so that, upon sintering, the uneven shrinkage of the unevenly shaped substrate would result in a substantially even fired substrate. In a similar approach, Elderbaum in U.S. Pat. No. 3,879,509, provides an additional layer of ceramic as a border about the perimeter of the substrate which fuses with the substrate during sintering. The border, naturally, shrinks at the same rate as the substrate so that it remains at the perimeter throughout the sintering process. The border is selected to be of sufficient thickness, length, width, and weight to restrain the edges from exhibiting camber but insufficient to prevent normal X-Y shrinkage of the greenware (Column lines 8-17). The fused border would subsequently be removed when sizing the finished sheet.

Weights have also been used by Dubetsky et al, U.S Pat. No. 4,340,436, during the processing of glass-ceramics. As noted above, there is a special requirement in the processing of glass-ceramics that the binder burn-off be conducted in a controlled atmosphere, such as an $H_2/H_2O$ ambient. The surface of the substrate must therefore remain unobstructed during the binder burn-off step. However, to conduct all heating and crystallization steps without restraints results in severe camber. Therefore, Dubetsky et al conducts a two-step process of heating the unencumbered substrate through binder burn-off, interrupting the heating process, placing platens coextensive with the substrate onto the substrate surface, and then re-firing through the sintering and crystallization phases. The fact remains, however, that up to 50% of the total fired shrinkage occurs during the initial binder burn-off step, during which the substrate surface is unrestrained.

All of the above processes have been useful methods for controlling camber, but not shrinkage. The subsequently described processes and means rectify not only the Z-curvature problem but also any X-Y shrinkage, via bulge and distortion in a single co-sintering step.

In order to prevent shrinkage, one applies a continual restraining force to the ceramic article during the entire sintering cycle. The restraining pressure applied is preferably in the range of 1-200 psi for MLC substrates, even though higher pressures may be utilized depending on the precise geometry and material properties of the MLC package, ceramic layers and conductors within. The restraining force may be applied a number of ways: a) peripheral or edge Z-force constraint wherein the weight, i.e. Z-force, overcomes the cohesive forces in the plane perpendicular to the Z-force; b) coextensive Z-force in the form of application of a force or weight to the entire substrate, which can be done either by using coextensive porous platens or by application of a coextensive airbearing force to the surface or surfaces of the substrate, each of which applies a uniform, coextensive Z-direction force to the ceramic element; or, c) coextensive frictional force in the form of a contact sheet laminated to the substrate wherein the contact sheet is comprised of a porous composition (preferably precrystallized) which will not sinter or shrink during the heating cycle and wherein the laminate will physically prohibit any shrinkage of the associated substrate.

Each of these means and methods will now be described in detail with reference to the drawings.

Figure 2:
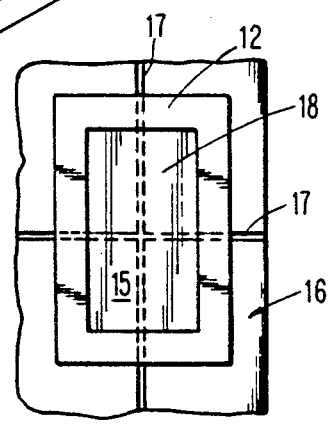
FIG. 2 is a top view of the edge-constraint system.

One embodiment of the subject invention, with reference to FIG. 1, includes the use of a weight, 12, placed on the upper surface, 18, of the MLC substrate, 15. The weight is designed to rest about the periphery, and constrain the edges, of the substrate. The upper surface, 18, of the substrate remains accessible to the atmospheric ambients as may be necessary for the binder to burn off. The open upper surface 15 is clearly shown in FIG. 2 which represents the top view of the assembly shown in FIG. 1. In addition, the weight, a single unit or a frame comprised of separate pieces chosen and assembled to conform to the edges of the desired size substrate, may be provided with holes, 13, or vents providing for atmospheric movement across the substrate. The weight or frame may also be provided with a coating of a protective layer, 14, such as $Al_2O_3$ when firing low temperature crystallizable glass-ceramics, located on the bottom surface of the weight which will not sinter or fuse to the ceramic but which will protect the substrate surface.

In practice, the substrate, protective layer, and frame are placed on a setter tile for insertion into the furnace. The underlying setter tile, 16, or greensheet, should also be material which will not sinter or fuse to the substrate, for example $Al_2O_3$ for glass-ceramics, and can be provided with shallow grooves, 17, to allow for the release of gas from under the substrate during firing. The use of a porous, non-sintering setter tile would be most advantageous as it would allow maximum atmospheric access to the bottom side of the substrate.

As further shown in FIG. 1, X, Y and Z are orthogonal axes or directions. The ceramic structure, i.e., the MLC substrate 15, is principally oriented in a plane that is defined by the X and Y axes, and the Z axis is perpendicular to this plane and the ceramic structure. During the sintering cycle, the X-Y shrinkage is prevented by the loading of the weight on only the edges of the substrate. The cohesive forces which are generated during sintering are unable to overcome the Z-direction restraining force on the weighted edges. Those cohesive forces are, therefore, redirected in the Z-direction resulting in densification in the Z, or free, direction only. It is desirable to maintain X-Y dimensions at zero shrinkage and place all sintering variation in the Z direction, which is not critical to the subsequent substrate processes. The X-Y tension generated by the cohesive forces of the densification process, along with the edge constraint, maintains surface flatness and eliminates camber. Since the distortion, shrinkage, and camber tendencies are overridden by the combined edge loading and cohesive forces, the effects of the differing rates of shrinkage and the differing onset temperatures for coalescence and sintering between the ceramic and any associated metallurgy are greatly reduced.

Figure 3:
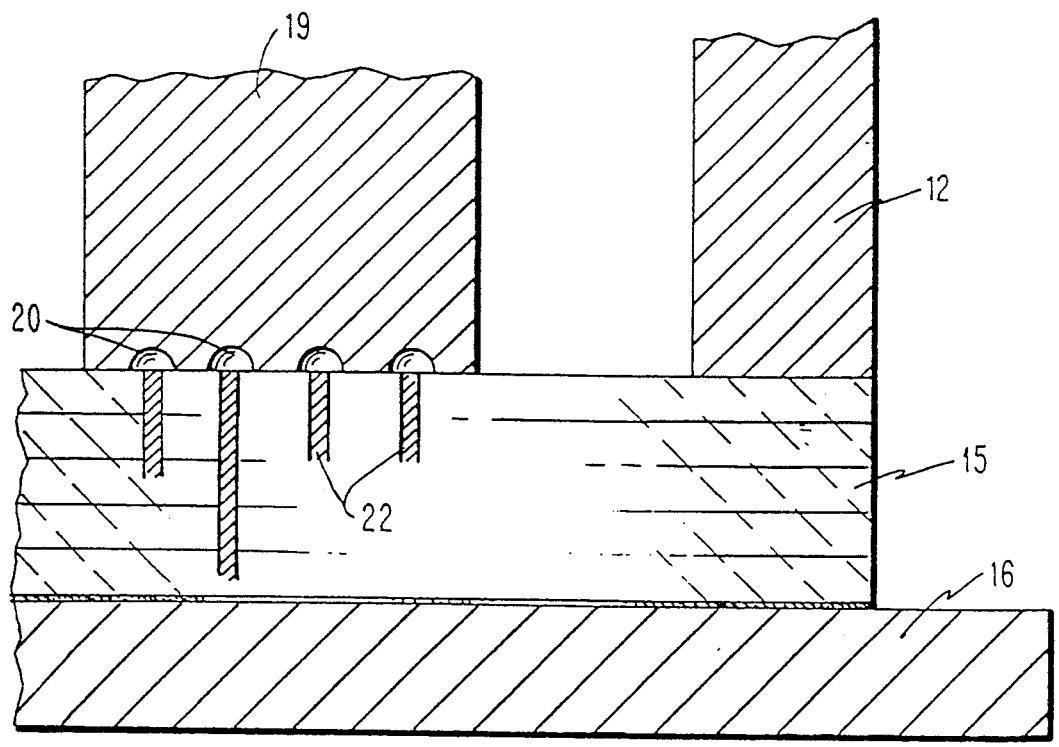
FIG. 3 is a sectional plan view of the substrate with edge-loading and via loading weights.

Depending upon the metallurgy used, some via bulging may be experienced, even if the edge-constrained process is utilized. Therefore, additional loads may be selectively placed on the surface of the ceramic about the vias, as illustrated in FIG. 3. Constant via bulge is achieved, independent of via depth, in the following manner. In addition to the edge loading during sintering, each via site, 22, is loaded with the same load/cm2 as is the edge of the substrate. The load may be applied in any one of many forms, such as the illustrated physical loading fixtures, or by use of a gas or air bearing pressure, as is discussed in conjunction with FIGS. 5 below. In the illustrated embodiment, the load is in the form of a square rod 12 or cylinder 19. The end of the rod 19 that contacts the via site is precision machined or etched to have a cavity over each via. The diameter and depth of the cavity, 20, is chosen to produce a via bulge with the desired size and height. Each cavity in the load may have the shape of a half-hemisphere and the array of cavities would precisely match the screened dimensions of the via footprint as shown in FIG. 3. During sintering, every via on the substrate is equally loaded. The load fixtures essentially provide a fixed expansion guide for the expanding via metallurgy, in addition to providing additional force to overcome the cohesive shrinkage forces.

As discussed above, another problem associated with loading the surface of the ceramic article during sintering is insufficient binder burn-out. With the addition of an array of rods over the via sites, the problem of binder burn-off is aggravated. Also, after binder burn-out, during the remainder of the sintering and crystallizing process and subsequent cooling, it is essential to maintain a controlled oxygen potential across the entire surface of the substrate, as discussed in the Herron et al U.S. Pat. No. 4,234,367 noted above. This may be achieved by coating the loading fixtures and the setter tile with cerium oxide or by making these load fixtures and tiles of porous cerium oxide. Cerium oxide, with controlled addition of lower valent cation dopants such as CaO, MgO, or $Y_2O$, is a mixed conductor having high ion and electron conduction. The dopants introduce oxygen vacancies in the crystal structure, which cannot therefore sustain an oxygen potential gradient across its structure. Whenever an oxygen potential gradient exists across doped cerium oxide, viz, on the surfaces in contact with the ceramic and the ambient, oxygen is transported electrochemically by bulk conduction through the cerium oxide and the gradient is eliminated. Therefore, the entire surfaces of the loading fixtures, rods and setter tile become equipotential with respect to oxygen. Thus, the parts of the surface of the ceramic that face the setter tile, loading fixtures and loading rods see the same oxygen potential as the parts of the surface openly exposed to the ambient, thereby enhancing binder burn-off. The oxygen will combine with the decomposing products and will be eliminated through the pores provided in the loads, fixtures and tiles.

Cerium oxide may also be utilized in connection with the coextensive pressure sintering embodiment of the subject invention, now to be addressed. The second embodiment of the invention, illustrated in FIG. 4, also utilizes the concept of overcoming the cohesive forces generated during sintering by use of a Z-direction force. As illustrated, the substrate, 15, is fired with a coextensive platen 24 on its surface. The platen, 24, is a porous platen chosen to provide sufficient Z-direction force, herein the weight of the platen, to overcome the cohesive forces in the sintering substrate. The platen may be composed of a prefired ceramic, such as alumina, or other high temperature material which will not sinter or fuse to the substrate. Porosity of the coextensive platen is essential in order to provide the necessary atmospheric access for binder burn-off as discussed in the preceding section. The porous platen may be made of cerium oxide or coated with same to enhance the burnoff step by utilizing the solid state diffusion properties of cerium oxide. The coextensive platen provides not only the Z-direction force needed to prevent X-Y shrinkage, by overcoming the cohesive forces, but also provides a uniform force to prevent cambering of the substrate. Furthermore, in the instance of firing a ceramic substrate having metallurgy-containing vias, the presence of the platen over the surface of the vias as well as the substrate will act to limit the via bulge experienced.

Figure 4:
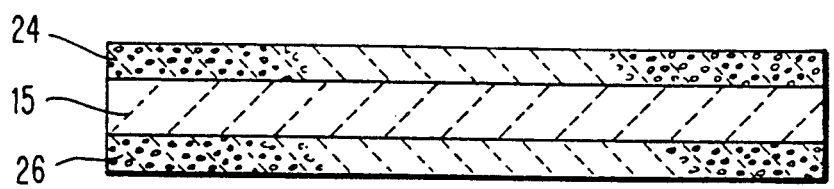
FIG. 4 is a plan view of the use of porous platens to apply a coextensive force to the sintering ceramic article.

When using a coextensive platen, the bottom surface of the sintering article must also be contacted. As illustrated in FIG. 4, the ceramic article is placed on a setter tile 26. It is, again, preferable that the setter tile used also be porous, possibly of a porous cerium oxide composite, or be provided with the channels, 17, of FIG. 1, in order to facilitate burn-off.

Figure 5A:
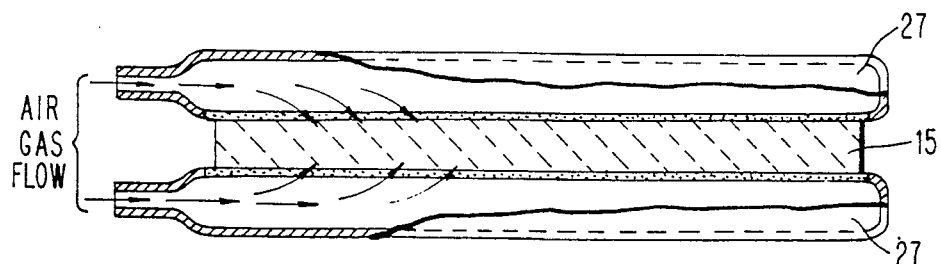
FIGS. 5(A-E) illustrate the application of a force to the substrate in the various forms of air-bearing.

FIGS. 5A through 5E illustrate alternative means and method for applying coextensive pressure to the surface of a sintering article. The embodiments exert a Z-direction force for overcoming the cohesive forces of the sintering ceramic and for prohibiting via bulge, camber and distortion, by utilizing gas pressure. FIG. 5A illustrates the use of hollowed plates or chambers having at least one porous, comprised of for example, precrystallized glass ceramic, alumina, surface porous cerium oxide, or a pre-sintered porous metal component which faces the ceramic surface. The plates, 27, are connected to an air, or other gas, supply by which the plates can be pressurized, forcing the air, or other gas such as the desired ambient, to the ceramic's surfaces. The pressure of the gas can be combined with external force applied in the Z direction and augmented by vacuum on opposing surfaces varied to exert the proper requisite level of loading on the ceramic. As with the previously discussed weighted platens, the application of coextensive pressure, here in the form of gas pressure, results in an elimination of camber, via bulge and X-Y shrinkage. In the conventional use of an air bearing system, the air bearing gap can be controlled at a minimum gap thickness of 25 µm or greater. The porosity of the plate components which face the ceramic surfaces allows for access of, and introduction of, the ambient to the surface and facilitates removal of the decomposition products. In the FIG. 5A embodiment, the ambient is introduced to the top and bottom ceramic surfaces. "Return" flow of the ambient and removal of the decomposition products is achieved through the free, unencumbered substrate surfaces, therein illustrated as the vertical sides of the substrate, 15. The FIG. 5B embodiment is similar in operation to the FIG. 5A embodiment, however 5B utilizes vacuum sources rather then pressurized gas sources. A vacuum drawn through the abutted plates (i.e. through the porous components in contact with the ceramic) acts to apply a weight onto the ceramic surfaces. Instead of gas-supply plates relying on atmospheric expulsion through the unencumbered sides of the porous ceramic, the FIG. 5B embodiment has plates, 28, which are connected to vacuum sources such that the ambient is drawn in through the unencumbered sides of the ceramic and the ambient plus decomposition products are drawn out by the vacuum through the porous components of the plates, 28. As discussed in the art, such as the above-referenced Herron et al patent on the firing cycle, a glass-ceramic substrate will remain porous through binder burn-out thereby allowing the escape of the by-products. In the instance of alumina, and some other ceramics, however, the porosity of the substrate itself may not be sufficient to permit by-products to escape. The embodiment of FIG. 5C, addresses this problem by utilizing one plate, 27, which is attached to a gas source, and a second plate, 28, which is connected to a vacuum source; so that the substrate is held to the latter plate, 28, by the vacuum, and the decomposition products are drawn from the sintering article, through the porous component of the vacuum-bearing plate, 28, and out. The combination of the directed pressure of the gas-bearing plate and the drawing of the vacuum creates the requisite Z-direction force in the FIG. 5C embodiment to prohibit shrinkage, etc.

Figure 5B:
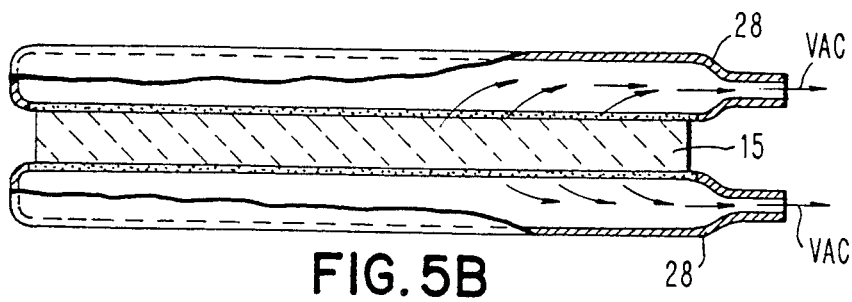
Figure 5C:
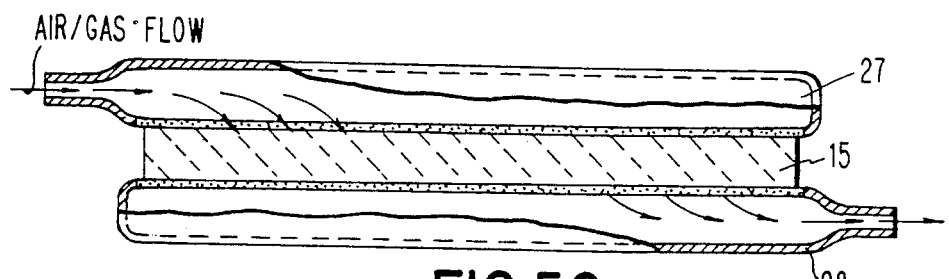
Figure 5D:
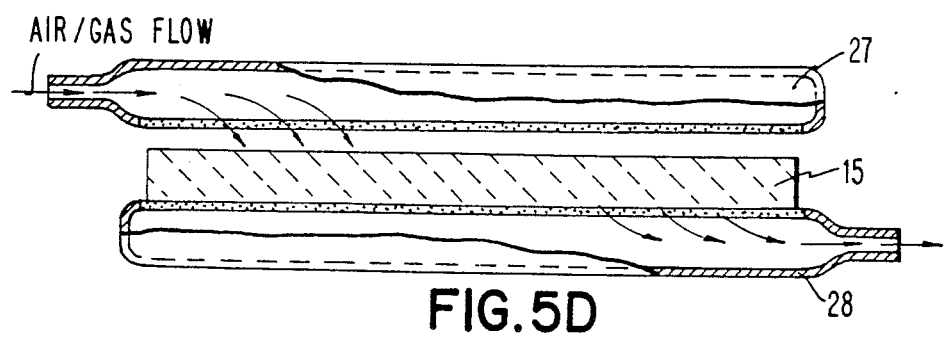
Figure 5E:
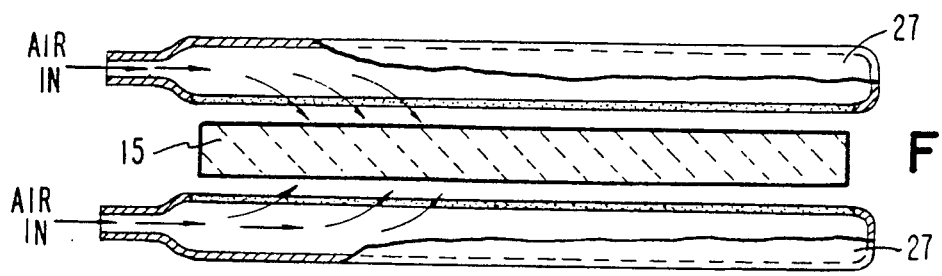

In all of the embodiments in FIGS. 5A through 5C, physical contact is maintained between the sintering article and the gas-bearing or vacuum-bearing plates. The application of a Z-direction force by gas pressure, however, does not require contact between the substrate and the gas or vacuum bearing plate. As illustrated in FIG. 5D, the gas-bearing plate, 27, may be freely supported using the air bearing technique at a distance from the ceramic surface. This is governed by the air bearing gas pressure. The porosity of the component of the plate which is facing the ceramic will, again, allow for the pressurized gas to be applied to the surface of the ceramic. Sustained pressure, the Z-direction force, exerted on the ceramic during the sintering cycle will provide the necessary counterpressure to prevent cambering, via bulging and distortion of the ceramic article, as discussed above. The combined effect of the Z-directed gas pressure and the vacuum drawing the substrate to the lower plate, 28, provide the necessary force to prohibit shrinkage, by overcoming the cohesive forces. As will be understood by one having ordinary skill in the art, the exact dual plate arrangement is not the necessary means for applying gas pressure and vacuum to a sintering article. The use of the non-contact plate, 27 in FIG. 5D, however, does provide an adaptable means for achieving the ends sought while also providing means to accurately regulate the flow and force of the gas onto the surface of the ceramic. In a further variation of the FIG. 5 embodiment, (E), the system is totally contactfree. The ceramic article to be sintered is suspended between the gas-bearing plates, held in place by the pressurized gases which are directed to its surfaces, in a true airbearing system. The ceramic article will, again, be unable to undergo cambering, distortion or via bulging. Some shrinkage may be experienced in the use of this relatively frictionless, totally airbearing system, however. The gas-bearing plates are providing a constant Z-direction pressure to the surfaces of the ceramic; however, the lack of physical restraint may result in some uniform, reproducible shrinkage, of the kind presently encountered and "designed around" in the art today. Those skilled in the art will appreciate that various combinations of pneumatic plates and other means may be adequate. For example, contact sheets may be placed between the setter tile and substrate, and a single hollowed pneumatic plate may be placed above the substrate.

Figure 6:
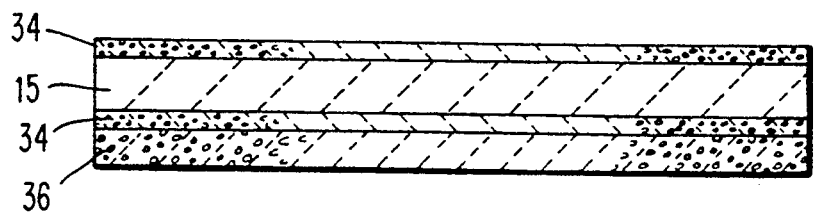
FIG. 6 illustrates the use of a frictional force applied to the substrate in the form of a laminated contact sheet.

The force required for conformal pressure sintering, is chosen to be sufficient to prohibit X-Y distortion, camber and via bulge, and control densification in the Z direction, but yet not sufficient to cause a total expansion of the substrate. A further embodiment of the invention, illustrated in FIG. 6, shows the coextensive frictional approach to the shrinkage problem wherein contact sheets are laminated onto the article to be sintered, and the sintering takes place with or without the use of additional weights. Contact sheets, reference numerals 34 in FIG. 6, of, for example, porous green sheets of alumina or glass, or precrystallized glass-/ceramic, are laminated onto the surfaces of the ceramic article, 15, before firing. Again, the composition of the material which is in contact with the ceramic must be such that it will not fuse to the ceramic. In addition, the contact sheet composition is chosen to be a material which is continuously porous; is thermally stable so that it will not undergo any shrinkage or expansion under the conditions of the ceramic sintering cycle; and, has continuous mechanical integrity/rigidity. The appropriate contact sheets maintain their dimensions during the ceramic firing cycle and necessarily, therefore, physically restrict the ceramic from shrinking. The laminated contact sheet-ceramic sandwich is then preferably placed on a setter tile, preferably a porous tile 36, and fired. Note that other sandwich loading schemes may be used. After the sintering and crystallization of the ceramic have been completed, the contact sheets are removed from the ceramic surfaces by use of an appropriate removal process which will not damage the surfaces of the ceramic, such as polishing, scraping, etc.

The process has been described with reference to the processing of a glass-ceramic/copper substrate. However, it can be effectively applied to any multilayer ceramic/metallurgy combination.

Although the invention has been described with reference to a preferred embodiment, it will be understood by those skilled in the art that modifications in detail may be made without departing from the spirit and scope of the invention.

What is claimed is:

1. A method for forming a sintered ceramic structure exhibiting substantially no X-Y shrinkage, distortion or camber, wherein X, Y and Z are orthogonal axes or directions, the ceramic structure is principally oriented in a plane that is defined by the X and Y axes, and the Z axis is perpendicular to said plane and said ceramic structure, comprising:
   providing a green ceramic structure;
   applying a continual restraining force to the surface of said green ceramic structure during the sintering cycle, wherein said restraining force will not fuse to said ceramic structure;
   firing said structure while it is subjected to said force.

2. The method of claim 1 wherein said restraining force is chosen to be sufficient to prohibit X-Y distortion, camber and shrinkage, during densification in the Z direction, but not sufficient to cause a total expansion of the substrate.

3. The method of claim 2 wherein said continual restraining force is applied by applying a peripheral Z directional force;
   said peripheral Z directional force being applied to at least one surface of said structure; and
   overcoming the cohesive forces in the X-Y plane.

4. The method of claim 3 wherein said continual restraining force is applied by applying a coextensive Z force over at least the entire upper surface of said structure;
   said Z directional force overcoming the cohesive forces in the X-Y plane.

5. The method of claim 4 wherein said coextensive Z force is applied by applying an airbearing force;
   said air-bearing force being applied to at least one surface of said structure, and
   overcoming the cohesive forces in the X-Y plane.

6. The method of claim 5 wherein said continual restraining force is applied by applying a frictional force;
   said frictional force being applied to at least one surface of said structure, and overcoming the cohesive forces in the X-Y plane.

7. The method of claim 4 or 5 or 6 further comprising;
   providing doped cerium oxide on substantially all surfaces in contact with said ceramic and the ambient;
   thereby allowing oxygen from the ambient to contact said ceramic structure, enhancing binder burnoff.

8. A method for forming a cured ceramic element exhibiting substantially no X-Y shrinkage, distortion or chamber comprising:
   providing a setter tile which is unaffected by firing temperatures;
   providing a laminated green sheet structure having a conductor pattern extending therebetween, on said setter tile, wherein X and Y are orthogonal axes or directions and the ceramic structure is principally oriented in a plane that is defined by the X and Y axes;
   clamping all of the circumscribing peripheral portions of the upper surface of said structure against lateral movement in the plane thereof and against non-uniform movement in the plane perpendicular thereto; and
   firing said structure, as clamped, to a temperature and for a time sufficient to cure said structure into said ceramic element.

9. The method of claim 8 further comprising the step of:
   providing an oxidizing atmosphere to the surfaces of said structure during firing to effect elimination of by-products from said structure.

10. The method of claim 9 wherein said green sheets comprise a dispersion of ceramic-forming particles in an organic binder, and wherein the outer surfaces of said green sheets, intermediate said peripheral portions thereof are provided for access to oxidizing atmospheres and venting of decomposition and oxidized products of said binder during said firing.

11. The method of claim 9 wherein said ceramic element comprises a glass-ceramic and said ceramic-forming particles comprise crystallizable glass particles and said conductor pattern comprises copper-based metallurgy and said oxidizing atmosphere comprises hydrogen to $H_2O$ ratio in the range of $10^{-4}$ to $10^{-6.5}$.

12. The method of claim 8 wherein said clamping is achieved by: aligning weighted platens about the perimeter of the structure on the upper surface of said structure said platens being provided with protective undercoating and venting holes.

13. The method of claim 8 wherein said setter tile is provided with channels allowing by-products of the firing step to be removed.

14. A method of fabricating a cured ceramic structure to provide improved control over shrinkage in the X-Y direction and to reduce distortion in the X-Y and Z directions to substantially zero distortion, wherein X, Y and Z are orthogonal axes or directions, the ceramic structure is principally oriented in a plane that is defined by the X and Y axes, and the Z axis is perpendicular to said plane and said ceramic structure, comprising the steps of:

providing a controlled frictional force in the X-Y direction, wherein said controlled frictional force will not fuse to said ceramic structure;

providing a force in the Z direction;

firing said structure while it is subjected to the X-Y and Z forces to achieve the desired degree of shrinkage in the X-Y direction and to reduce the distortion.

15. The method of claim 14 wherein the controlled friction forces are provided by clamping the structure along its periphery to a setter tile, which clamping action also provides a force in the direction.

16. The method of claim 14 wherein said forces are provided by supporting said structure between two chambers having porous walls abutting the substrate and gas under pressure is introduced into the chambers and through the porous walls during sintering.

17. The method of claim 14 wherein said forces are provided by supporting the substrate between two chambers having porous walls abutting the structure and supplying gas under pressure in the first of said chambers and evacuating the second of said chambers.

18. The method of claim 14 wherein said forces are provided by maintaining the substrate in intimate contact with the porous wall of a first chamber connected to a negative pressure, and a second chamber having a porous wall is maintained at a predetermined spacing from the substrate and provided with gas under positive pressure during firing.

19. The method of claim 14 wherein said forces are produced by supporting the structure between porous walls of two chambers and evacuating said chambers.

20. The method of claim 14 wherein said frictional forces are produced by laminating a pair of porous green-sheets of precrystallized glass-ceramic to the top and bottom surfaces of said structure respectively, firing the laminated assembly and removing said greensheets.

21. The method of claim 14 wherein said frictional forces are produced by laminating a pair of porous greensheets having high alumina content to the top and bottom surfaces of said structure respectively, firing the laminated assembly and removing said greensheets.

* * * * *